(12) United States Patent  
Schmidt

(10) Patent No.: US 7,667,376 B2
(45) Date of Patent: Feb. 23, 2010

(54) ENERGY CONVERTER ARRANGED ON ROTATING ELEMENTS AND USED TO CONVERT MECHANICAL ENERGY INTO ELECTRIC ENERGY

(75) Inventor: Frank Schmidt, Zorneding (DE)

(73) Assignee: EnOcean GmbH, Oberhaching (DE)

( * ) Notice: Subject to any disclaimer, the term of this patent is extended or adjusted under 35 U.S.C. 154(b) by 652 days.

(21) Appl. No.: 11/455,360

(22) Filed: Jun. 19, 2006

(65) Prior Publication Data

US 2008/0258581 A1  Oct. 23, 2008

Related U.S. Application Data

(63) Continuation of application No. PCT/DE2004/002388, filed on Oct. 27, 2004.

(30) Foreign Application Priority Data

Dec. 19, 2003  (DE) .................................. 103 59 990

(51) Int. Cl.
*H01L 41/107* (2006.01)
*H02N 2/18* (2006.01)
(52) U.S. Cl. ....................................................... 310/339
(58) Field of Classification Search .................. 310/339
See application file for complete search history.

(56) References Cited

U.S. PATENT DOCUMENTS

| 4,504,761 | A | * | 3/1985 | Triplett ....................... 310/339 |
|---|---|---|---|---|
| 4,510,484 | A | | 4/1985 | Snyder et al. |
| 6,237,403 | B1 | | 5/2001 | Oldenettel et al. |
| 6,411,016 | B1 | * | 6/2002 | Umeda et al. ............... 310/339 |
| 7,078,850 | B2 | * | 7/2006 | Sakai .......................... 310/339 |
| 7,081,693 | B2 | * | 7/2006 | Hamel et al. ................ 307/151 |
| 7,132,757 | B2 | * | 11/2006 | Steigerwald et al. ........ 290/1 R |
| 7,157,835 | B2 | * | 1/2007 | Sakai .......................... 310/339 |
| 7,429,801 | B2 | * | 9/2008 | Adamson et al. ............ 290/1 R |
| 2003/0058118 | A1 | * | 3/2003 | Wilson ........................ 340/679 |
| 2008/0079333 | A1 | * | 4/2008 | Ulm et al. .................... 310/339 |
| 2008/0100182 | A1 | * | 5/2008 | Chang et al. ................. 310/339 |
| 2008/0129153 | A1 | * | 6/2008 | Roundy et al. .............. 310/339 |
| 2008/0136292 | A1 | * | 6/2008 | Thiesen ....................... 310/334 |
| 2008/0258581 | A1 | * | 10/2008 | Schmidt ...................... 310/348 |
| 2008/0277941 | A1 | * | 11/2008 | Bowles et al. ................. 290/54 |

FOREIGN PATENT DOCUMENTS

| DE | 196 27 998 A1 | 8/1997 |
|---|---|---|
| DE | 199 29 341 A1 | 12/2000 |
| DE | 199 53 489 C1 | 5/2001 |
| DE | 100 25 561 A1 | 12/2001 |

(Continued)

*Primary Examiner*—J. SanMartin
(74) *Attorney, Agent, or Firm*—Cohen Pontani Lieberman & Pavane LLP

(57) ABSTRACT

An energy converter arranged on a rotating element and used for converting mechanical energy into electrical energy, having a converter element (2) for converting the mechanical energy into electrical energy and a first mass (M1) and a second mass (M2), the second mass (M2) being connected to the rotating element. The converter element (2) is arranged between the first mass (M1) and the second mass (M2) such that a mechanical relative movement of the two masses (M1, M2) acts on the converter element (2) so as to generate electrical energy.

5 Claims, 3 Drawing Sheets

FOREIGN PATENT DOCUMENTS

| | | |
|---|---|---|
| DE | 101 25 059 A1 | 12/2002 |
| DE | 102 59 056 A1 | 9/2004 |
| GB | 2 064 883 A | 11/1980 |
| WO | WO 98/36395 | 8/1998 |
| WO | WO 99/49556 | 9/1999 |
| WO | WO 2004/051823 A | 6/2004 |

* cited by examiner

ENERGY CONVERTER ARRANGED ON ROTATING ELEMENTS AND USED TO CONVERT MECHANICAL ENERGY INTO ELECTRIC ENERGY

RELATED APPLICATIONS

This is a continuation of International Application No. PCT/DE2004/002388, filed on Oct. 27, 2004, which claims priority from German Patent Application No. 103 59 990.8, filed on Dec. 19, 2003, the content of which is hereby incorporated by reference.

FIELD OF THE INVENTION

The invention relates to an energy converter arranged on a rotating element and used for converting mechanical energy into electrical energy, having a converter element for converting the mechanical energy into electrical energy, and a first mass and a second mass, the second mass being connected to the rotating element.

BACKGROUND OF THE INVENTION

Battery-operated energy supplies are generally used for supplying electronic circuits such as small radio transmitters, small sensors associated with radio transmitters, so-called radio sensors, radio switches or the like, which are often fitted to rotating elements for the purpose of monitoring or measuring a physical parameter. One disadvantage of the battery-operated energy supplies is the limited service life of the energy store battery which then needs to be replaced by a new battery or a new energy store. This requires a high degree of complexity in terms of maintenance and may lead to unnoticed failures of the electronic circuit in conjunction with the sensor and the devices also associated therewith.

Alternatively, energy converters are known, such as electromagnetic magnetostrictive or piezoelectric converters, which can also be implemented in a compact design and, inter alia, are suitable for converting movement energy into electrical energy, primarily in a sufficient amount.

Should such a sensor or energy supply for supplying such circuits be mounted on rotating elements, an additional problem arises in the case of these rotating elements. This problem arises as a result of the severe rotational centrifugal forces. These rotational centrifugal forces have the effect that the electrodynamic magnetostrictive or piezoelectric converter elements remain deflected owing to the rotational centrifugal forces and therefore can no longer contribute to the energy supply in this form. Very small manufacturing tolerances or assembly tolerances may further intensify this problem.

SUMMARY OF THE INVENTION

One object of the invention is to provide an energy converter which is capable of supplying electronic circuits, which are mounted on rotating elements, with energy even when rotational centrifugal forces are present.

Such an energy converter does not use the rotational energy per se for generating the energy but uses movements superimposed thereon or changes in the speed of rotation.

This and other objects are attained in accordance with one aspect of the present invention directed to an energy converter arranged on a rotating element and used for converting mechanical energy into electrical energy, comprising a converter element for converting the mechanical energy into electrical energy, a first mass, a second mass, coupled to the rotating element, wherein the converter element is arranged between the first mass and the second mass such that a mechanical relative movement of the two masses acts on the converter element so as to generate electrical energy. A mechanically movable connection between the first mass and the second mass is formed by the converter element such that the first mass can only be moved in a first plane. The second mass is movably connected to the rotating element such that the plane is at right angles to a rotational centrifugal force.

An arrangement in which the freedom of movement between the first mass and the second mass is restricted such that the first mass can only move with respect to the second mass in one plane results in independence of the force acting on the first mass in the direction of the rotational centrifugal force. The converter element is therefore independent of these forces. Only forces which find their origin in a movement superimposed on the rotation or in a change in the rotation then act on the first mass and cause it to move.

In one further advantageous embodiment, the connection between the second mass and the rotating element is designed such that the rotational centrifugal force aligns the second mass precisely such that the plane in which the first mass can move is at right angles to the rotational centrifugal force. Any assembly tolerance or manufacturing tolerance of the energy converter is therefore advantageously eliminated. The connection between the rotating element and the second mass is designed such that it is mounted such that it can rotate, for example by means of a spring element or an axis. This means that the second mass is aligned precisely under the influence of the rotational centrifugal force, in a similar manner to a centrifugal force pendulum. The plane in which the first mass moves is therefore likewise precisely aligned and is at right angles to the rotational centrifugal force.

If the first mass is observed during an imaginary period of time t, the first mass describes an orbit which has its center in the axis of rotation of the rotating element. The plane in which the first mass moves lies tangentially precisely on this orbit. Owing to the alignment of the second mass as a result of the rotational centrifugal force and the mechanical connection between the first mass and the second mass, which is designed such that it can only move in one plane which is at right angles to the rotational centrifugal force, the first mass does not need to perform any lifting work in the field of force of the rotational centrifugal force. It is therefore ensured, even in the case of small or larger manufacturing and assembly tolerances, that the first mass is not held fixedly by the rotational centrifugal force in a deflection in which further forces or movements would be relatively ineffective on the first mass for generating electrical energy.

The type of converter element is independent of this previously described principle and could be a piezoelectric, a magnetostrictive or an electromagnetic converter element, in principle other converter elements also being suitable for this purpose if they are capable of converting mechanical energy into electrical energy. This is particularly the case because the converter element is protected from the extreme rotational centrifugal forces by the abovementioned measures.

BRIEF DESCRIPTION OF THE DRAWINGS

The invention will be explained in more detail below with reference to exemplary embodiments and to figures, in which.

DETAILED DESCRIPTION OF THE DRAWINGS

Figure 1:
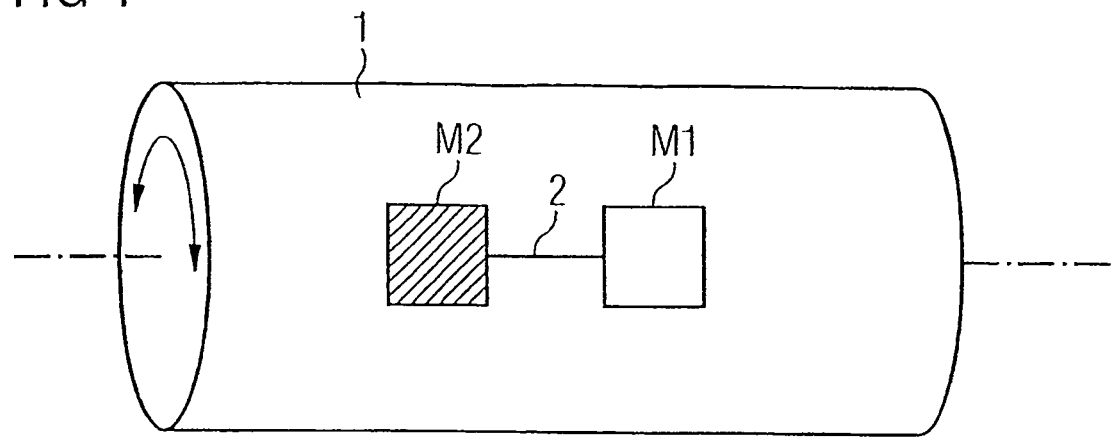
FIG. 1 shows a schematic illustration of a rotating element having an energy converter.

FIG. 1 shows a schematic illustration of a rotating element 1 which rotates about an axis. A second mass M2, which is connected to a converter element 2, is arranged on this rotating element 1. A first mass M1, which is likewise connected to the converter element 2, is freely movable with respect to the rotating element 1. Each movement of the rotating element 1, or each change in rotation or each movement which is independent of the rotation acts on the mass M1 and leads to a relative movement of the first and the second masses M1, M2 in relation to one another. This relative movement brings about a force on the converter element 2 and leads to electrical energy being generated at said converter element 2 due to separation of positive and negative charges.

Figure 2:
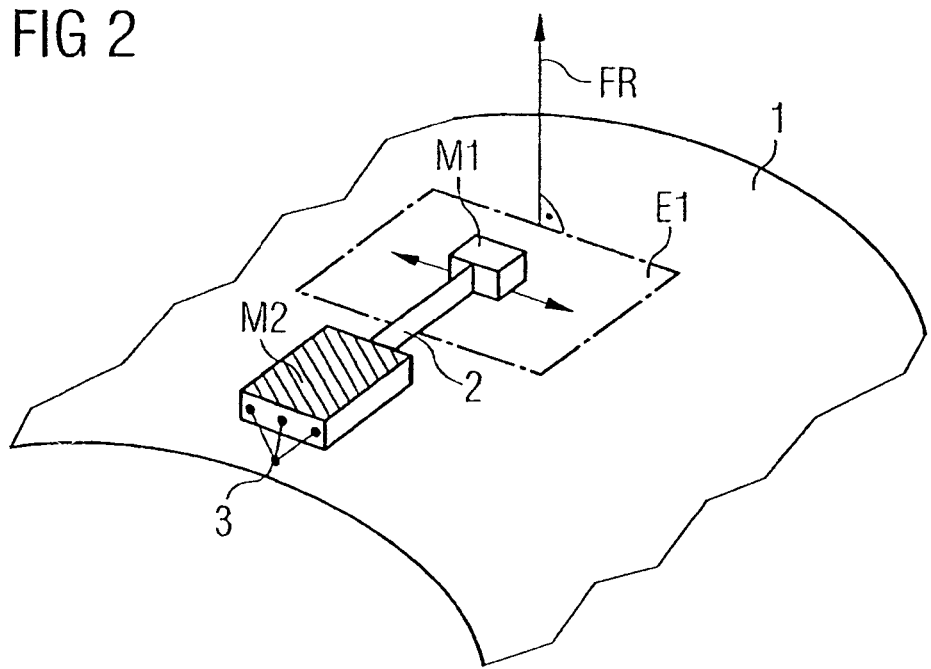
FIG. 2 shows a perspective schematic illustration of a rotating element having an energy converter.

FIG. 2 shows a schematic illustration in a perspective view, the rotating element 1 only being illustrated partially. The rotating element 1, owing to its rotation, brings about a rotational centrifugal force FR, which is at right angles to the axis of rotation of the rotating element 1. The second mass M2, which is fixed and arranged on the rotating element 1, is fixed to said rotating element 1 by means of a bearing 3 such that the mass M2 can move about this bearing 3. When the rotating element rotates, the rotational centrifugal force FR brings about a precise alignment of the second mass M2, with the result that the center of gravity of the second mass M2 is at an energetic minimum under the influence of the centrifugal force occurring during the rotation. Furthermore, the first mass M1 is connected to the second mass M2 via the converter element 2 such that the first mass M1 can exclusively move in a plane E1. Owing to the alignment of the second mass M2 and the connection between the first mass M1 and the second mass M2, in the manner described above, the plane E1 is aligned at right angles with respect to the rotational centrifugal force FR. This means that the mass M1 moves in a plane which is tangential with respect to an orbit around the axis of rotation. In the case of small movements, this means that the mass M1 does not need to perform any lifting work in the field of force of the rotational centrifugal force.

Figure 3:
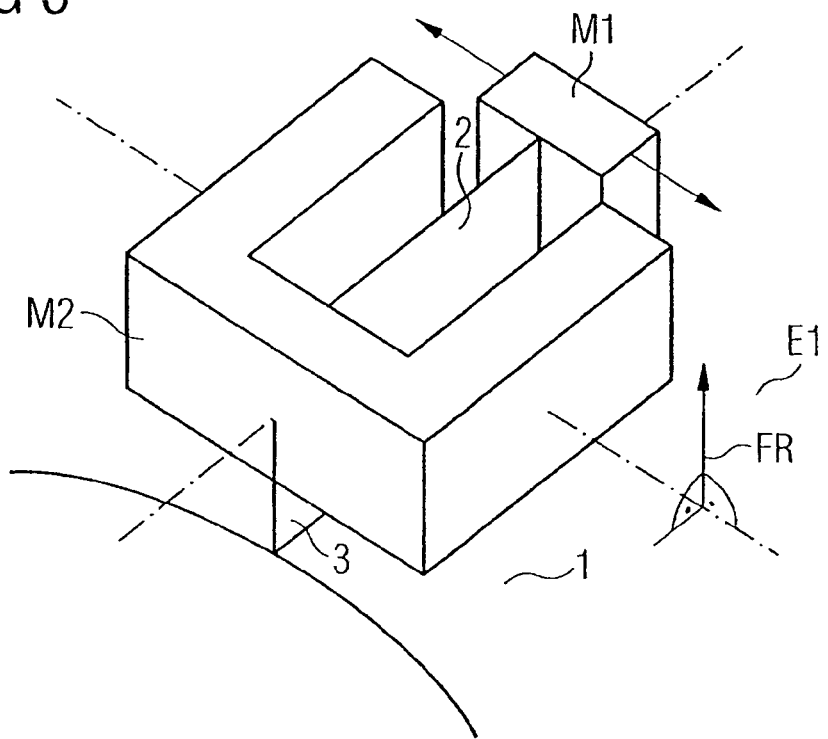
FIG. 3 shows a detailed illustration of an exemplary embodiment of the energy converter on a rotating element.

FIG. 3 shows a partially schematic illustration of an exemplary embodiment of an energy converter, which is fixed on a rotating element 1 via a bearing or a flexible metal sheet, for example a spring, 3 on the rotating element 1. In this case, the mass M2 is designed to be greater than the mass M1, which means that the deflection of the mass M2 which is brought about by the centrifugal force is not influenced by the mass M1. In this exemplary embodiment, the converter element 2 is a piezoelectric element, which is connected to the mass M1. In this exemplary embodiment, the mass M1 oscillates in the directions indicated by the direction of the arrow. The freedom of movement of the first mass M1 is restricted in the process to the plane E1. The plane E1 is formed by the suspension of the mass M2 via the spring 3 and is at right angles to the rotational centrifugal force FR.

Spring 3 can be a sheet metal spring vertically fixed at one end on the surface rotating element 1. The longitudinal axis of the sheet metal spring is parallel to the rotational axis of the rotating element. The mass M2 is fixed to the opposite end of the sheet metal spring.

If the sheet metal is not elastic as a spring, it is fixed to the rotating element 1 with a pivotable bearing in order to achieve the above-described result. Alternatively, the pivotable bearing can include an elastic element to achieve the effect of a sheet metal spring.

Figure 4:
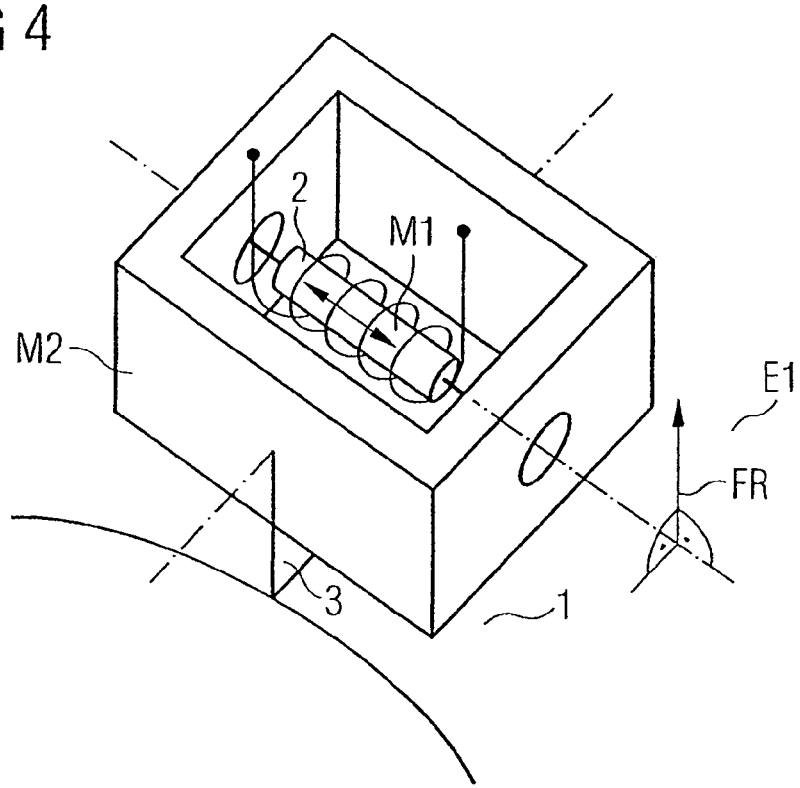
FIG. 4 shows another embodiment of the energy converter on a rotating element.

FIG. 4 shows an energy converter which is similar to the exemplary embodiment in FIG. 3, the suspension and fixing on the rotating element 1 being the same as the suspension described and illustrated in FIG. 3. The differences in FIG. 4 essentially relate to the shape of the converter element 2, which is represented as an inductive or electromagnetic converter element. In this exemplary embodiment, the first mass M1 oscillates in a coil, the freedom of movement of the first mass M1 being limited to the plane E1 in this case too.

Figure 5:
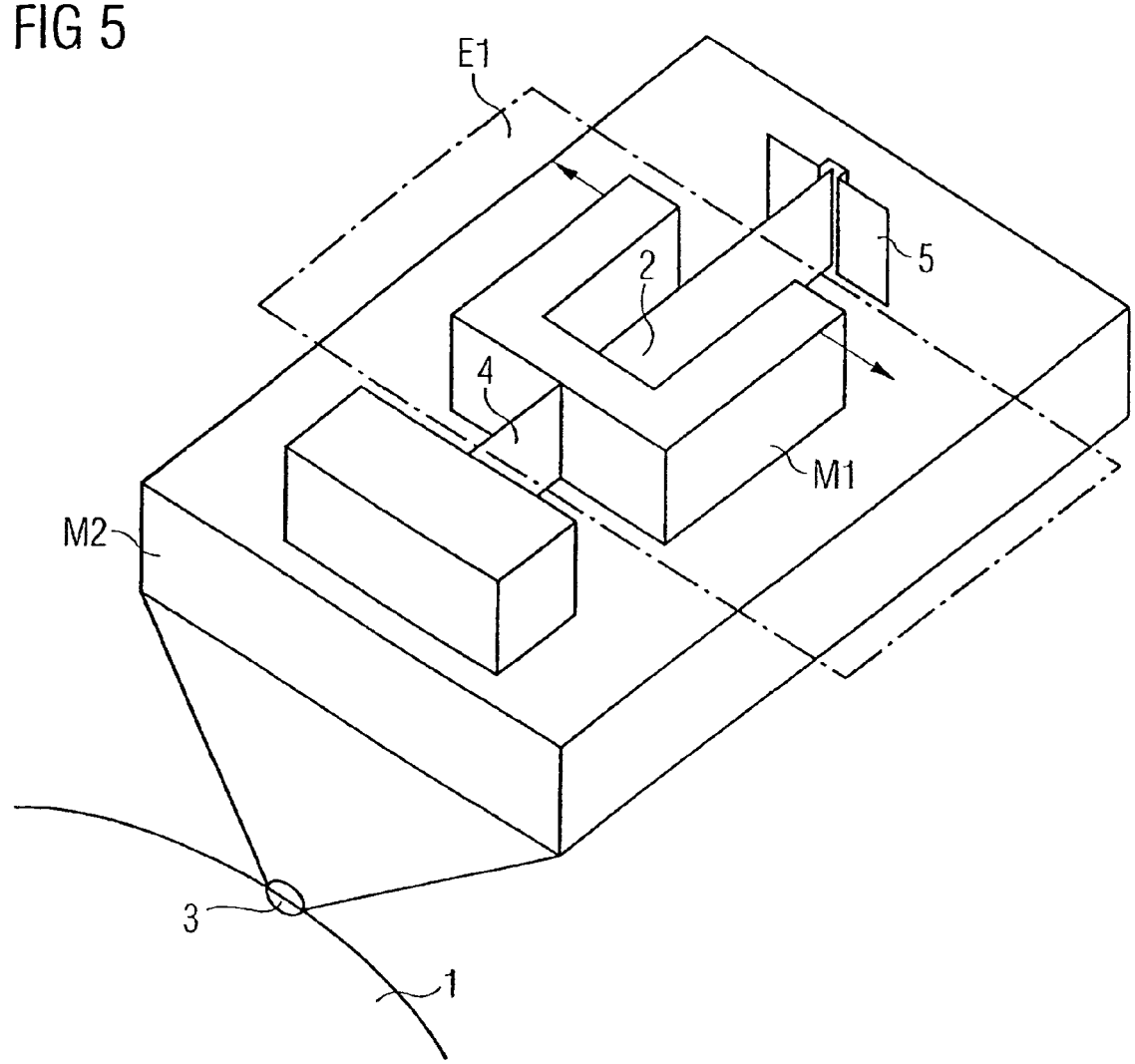
FIG. 5 shows a further embodiment of the energy converter on a rotating element.

FIG. 5 shows a partially schematic illustration of an exemplary embodiment of an energy converter, which is fixed on a rotating element 1 via a bearing or a flexible metal sheet, for example a spring, 3 on the rotating element 1. The bearing can be a triangular construction, built of two sheet metal pieces arranged together at an angle, with this construction being arranged pivotally with its apex on the surface of the rotating element, in such a way that the axis of rotation of the rotating element and the axis of rotation of this pivotable construction are parallel. Alternatively, the pivotable fixing can comprise an elastic element to achieve the same effect as a spring.

The mass M2 is in this case designed to be greater than the mass M1, which means that the deflection of the mass M2 brought about by the centrifugal force is not influenced by the mass M1. In this exemplary embodiment, the converter element 2 is a piezoelectric element which is connected to the mass M1. In this exemplary embodiment, the mass M1 oscillates in the directions indicated by arrows. As an extension of the embodiment illustrated in FIG. 3, the mass M1 is connected to the mass 2 by an elastic element 4. This elastic element 4 is designed such that the mass M1 can only move in one plane. Furthermore, the converter element 2 is fixedly connected to the mass M1 at one end and, at the opposite end, is held via a bearing element 5. If a movement of the mass M1 takes place in the plane E1, deformation of the converter element 2 takes place. The bearing element is fixedly connected to the mass M2 and designed such that the converter element 2 is not held in the direction of the rotational centrifugal force FR. Although the movement of the converter element is in the direction of the rotational centrifugal force FR is low due to the properties of the elastic element 4, or is not provided, deformation of the converter element brought about thereby is therefore also ruled out. The freedom of movement of the first mass M1 is restricted by the elastic element 4 to the plane E1. The plane E1 is formed by the suspension of the mass M2 via the spring 3 and is at right angles to the rotational centrifugal force FR.

The scope of protection of the invention is not limited to the examples given hereinabove. The invention is embodied in each novel characteristic and each combination of characteristics, which includes every combination of any features which are stated in the claims, even if this combination of features is not explicitly stated in the claims.

I claim:

1. An energy converter arranged on a rotating element and used for converting mechanical energy into electrical energy, comprising:
   a converter element for converting the mechanical energy into electrical energy;
   a first mass;
   a second mass, coupled to the rotating element;
   wherein the converter element is arranged between the first mass and the second mass such that a mechanical relative movement of the two masses acts on the converter element to generate electrical energy;

wherein a mechanically movable connection between the first mass and the second mass is formed by the converter element such that the first mass can only be moved in a first plane; and wherein the second mass is movably connected to the rotating element such that during rotation of the rotating element a rotational centrifugal force causes an alignment of the second mass such that the first plane is at right angles to the rotational centrifugal force.

2. The energy converter as claimed in claim 1, wherein the converter element is a piezoelectric or a magnetostrictive or an electromagnetic converter element.

3. The energy converter as claimed in claim 1, wherein the arrangement of the converter element with respect to the first mass is designed to be flexible, resilient or fixed.

4. The energy converter as claimed in claim 1, wherein the first mass is flexibly, resiliently or fixedly connected to the converter element.

5. The energy converter as claimed in claim 1, wherein the second mass is pivot-mounted onto to the rotating element by means of at least one of a mechanical bearing and a spring and an axis of rotation.

* * * * *